(12) United States Patent
Tatah

(10) Patent No.: US 9,437,229 B2
(45) Date of Patent: Sep. 6, 2016

(54) ISOLATOR ELEMENT FOR HEAT-ASSISTED MAGNETIC RECORDING

(71) Applicant: Seagate Technology LLC, Cupertino, CA (US)

(72) Inventor: Karim Tatah, Eden Prairie, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/680,252

(22) Filed: Apr. 7, 2015

(65) Prior Publication Data

US 2015/0295384 A1  Oct. 15, 2015

Related U.S. Application Data

(60) Provisional application No. 61/977,262, filed on Apr. 9, 2014.

(51) Int. Cl.

| | | |
|---|---|---|
| *G11B 5/48* | (2006.01) | |
| *G11B 5/00* | (2006.01) | |
| *H01S 5/00* | (2006.01) | |
| *H01S 5/34* | (2006.01) | |
| *G11B 5/31* | (2006.01) | |
| *G11B 5/60* | (2006.01) | |
| *G11B 7/1384* | (2012.01) | |
| *G02B 6/42* | (2006.01) | |

(52) U.S. Cl.
CPC .......... *G11B 5/4866* (2013.01); *G02B 6/4208* (2013.01); *G11B 5/314* (2013.01); *G11B 5/6088* (2013.01); *G11B 7/1384* (2013.01); *H01S 5/0064* (2013.01); *H01S 5/34* (2013.01); *G11B 2005/001* (2013.01); *G11B 2005/0021* (2013.01)

(58) Field of Classification Search
CPC   G02B 6/1225; G02B 5/4866; G02B 6/2746; G02B 6/4208; G11B 5/314; G11B 2005/0021; G11B 2005/001; G11B 7/1384; G11B 7/1206; G11B 11/10554
USPC .............................. 369/13.13, 13.33, 112.27
See application file for complete search history.

(56) References Cited

U.S. PATENT DOCUMENTS

| | | |
|---|---|---|
| 5,850,375 A | 12/1998 | Wilde et al. |
| 5,999,303 A | 12/1999 | Drake |
| 6,360,035 B1 | 3/2002 | Hurst, Jr. et al. |

(Continued)

FOREIGN PATENT DOCUMENTS

| | | |
|---|---|---|
| EP | 0965986 | 12/1999 |
| EP | 2573769 | 3/2013 |

OTHER PUBLICATIONS

Ansari et al., "Multicolor filter all-garnet magneto-optical photonic crystals", Optics Letters, vol. 37, No. 17, Sep. 1, 2012, pp. 3552-3554.

(Continued)

*Primary Examiner* — Ali Neyzari
(74) *Attorney, Agent, or Firm* — Hollingsworth Davis, LLC

(57) ABSTRACT

An apparatus with a slider body, a laser diode, and an isolator element. The slider body has an optical pathway extending therealong. The laser diode is configured to emit light along the optical pathway. The isolator element is disposed in the optical pathway to reduce optical feedback along the optical pathway back to the laser diode. In some embodiments, the isolator element is disposed in the optical pathway between the laser diode and the slider body.

18 Claims, 8 Drawing Sheets

(56) References Cited

U.S. PATENT DOCUMENTS

| | | |
|---|---|---|
| 6,574,015 B1 | 6/2003 | Tselikov et al. |
| 6,798,729 B1 | 9/2004 | Hurst, Jr. et al. |
| 6,936,195 B2 | 8/2005 | Fan et al. |
| 7,474,813 B2 | 1/2009 | Shi et al. |
| 8,000,175 B2 * | 8/2011 | Shimazawa .............. G11B 5/02 360/59 |
| 8,102,588 B2 | 1/2012 | Alameh et al. |
| 8,194,509 B2 * | 6/2012 | Shimazawa ............ G11B 5/314 369/13.13 |
| 8,279,901 B2 * | 10/2012 | Karavitis .............. H01S 3/0057 359/348 |
| 8,355,299 B2 * | 1/2013 | Sasaki .................... G11B 11/00 29/603.07 |
| 8,379,495 B2 | 2/2013 | Boone, Jr. et al. |
| 8,441,895 B2 * | 5/2013 | Shimazawa ............ G11B 5/314 369/13.13 |
| 8,599,655 B2 * | 12/2013 | Osawa ................... G11B 5/314 369/13.33 |
| 8,902,739 B2 * | 12/2014 | Tarraf ..................... H04L 47/10 370/229 |
| 9,165,572 B2 * | 10/2015 | Takei ................... G11B 5/6088 |
| 2011/0206073 A1 | 8/2011 | Karavitis |
| 2013/0163622 A1 | 6/2013 | Karavitis |

OTHER PUBLICATIONS

Grishin et al., "Luminescence in epitaxial Er-doped LiNbO3 films", Optics Letters, vol. 37, No. 3, Feb. 1, 2012, pp. 419-421.

Kahl, "Bishmuth iron garnet films for magneto-optical photonic crystals", 145 pages.

Khartsev et al., "High performance latching-type luminescent magneto-optical photonic crystals", Optics Letters, vol. 36, No. 15, Aug. 1, 2011, pp. 2806-2808.

* cited by examiner

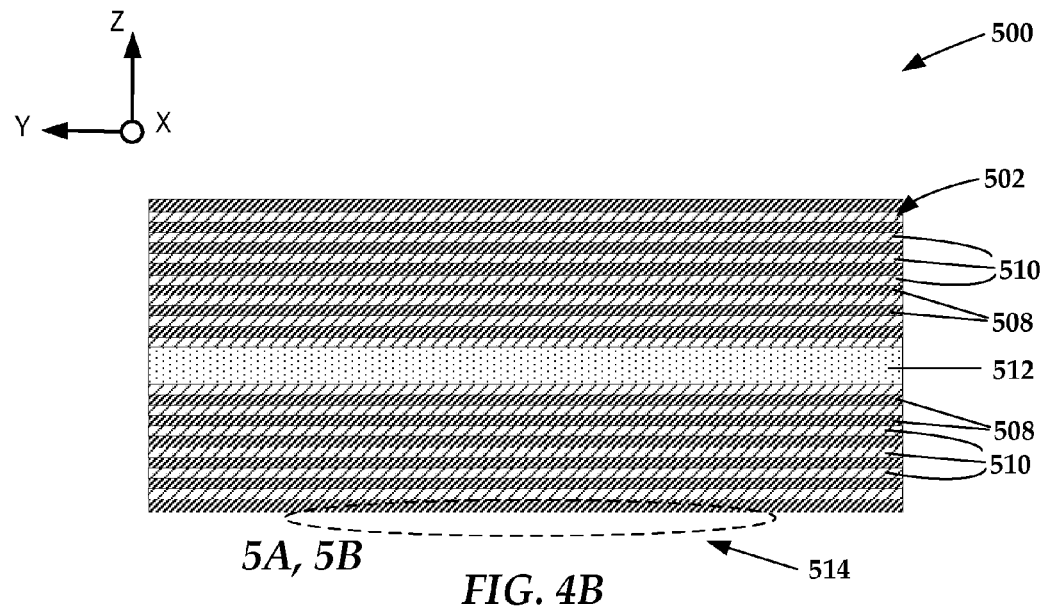
FIG. 4B
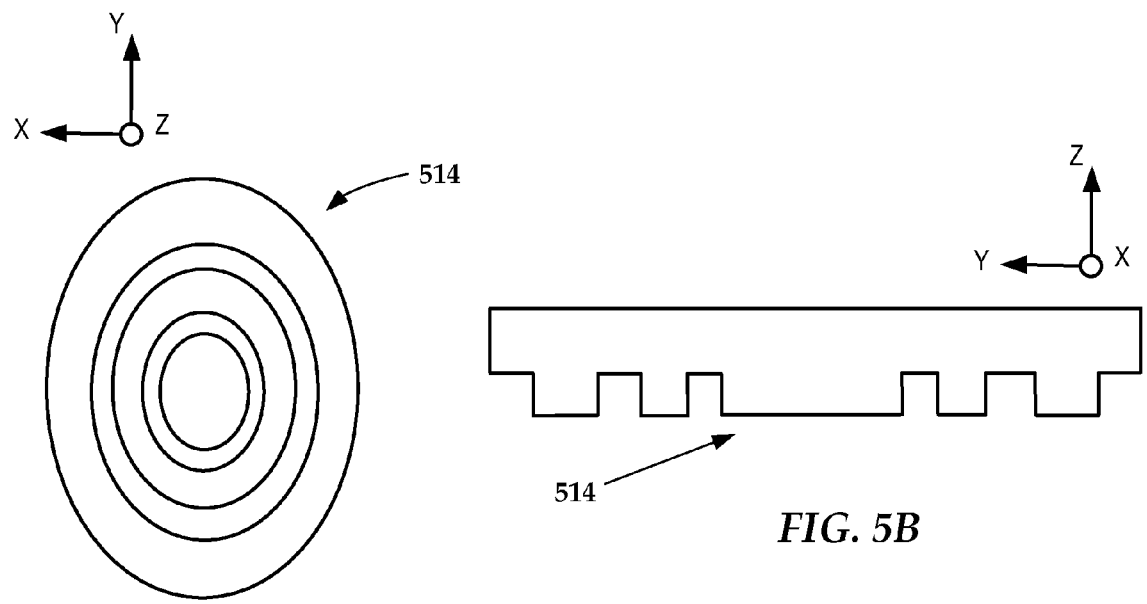
FIG. 5A
FIG. 5B

ISOLATOR ELEMENT FOR HEAT-ASSISTED MAGNETIC RECORDING

RELATED PATENT DOCUMENTS

This application claims the benefit of Provisional Patent Application Ser. No. 61/977,262 filed on Apr. 9, 2014, to which priority is claimed pursuant to 35 U.S.C. §119(e), and which is incorporated herein by reference in its entirety.

SUMMARY

Embodiments disclosed include an apparatus with a slider body, a laser diode, and an isolator element. The slider body has an optical pathway extending therealong. The laser diode is configured to emit light along the optical pathway. The isolator element is disposed in the optical pathway to reduce optical feedback along the optical pathway back to the laser diode.

Embodiments are directed to an apparatus with a system configured to facilitate heat assisted magnetic recording. The system includes a slider body, a laser diode mounted to the slider body, and an isolator element. The isolator element is disposed in an optical pathway between the laser diode and the slider body to reduce optical feedback along the optical pathway back to the laser diode.

Further embodiments are directed to a method that includes providing an apparatus configured to facilitate heat assisted magnetic recording and disposing an isolation element in an optical pathway of the apparatus to reduce optical feedback to a laser diode.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein:

FIG. 4B is a cross-sectional view of yet another embodiment of the isolator element;

FIG. 5A is perspective view of a micro-lens formed on the isolator element of FIG. 5;

FIG. 5B is a cross-sectional view of the micro-lens of FIG. 5A;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
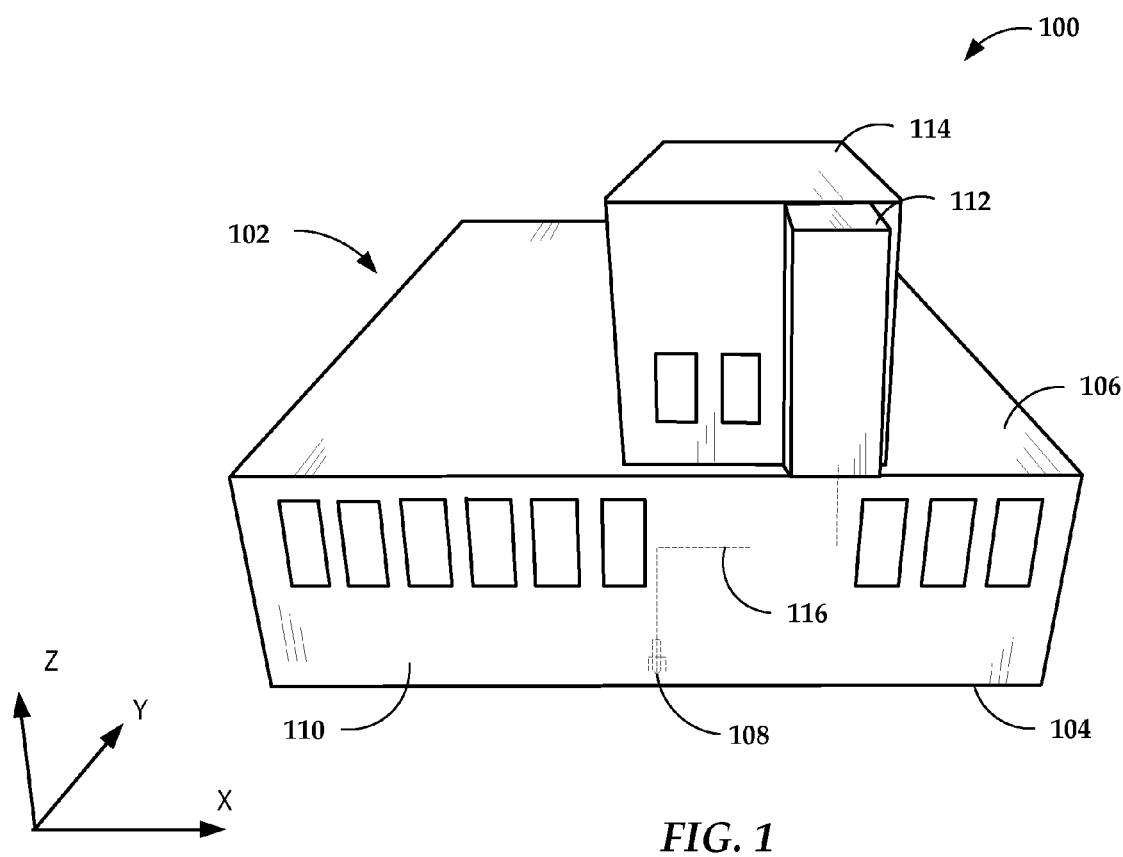
FIG. 1 is a perspective view of an apparatus that includes a hard drive slider, a submount, a laser diode, and an isolator element according to an exemplary embodiment.

In the following description, reference is made to the accompanying set of drawings that form a part of the description hereof and in which are shown by way of illustration several specific embodiments. It is to be understood that other embodiments are contemplated and may be made without departing from the scope of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The present disclosure relates to optical transmission paths. Such optical transmission paths may be included in heat-assisted magnetic recording (HAMR), which can be used to increase areal data density of magnetic media. In a HAMR device, information bits are recorded in a storage layer at elevated temperatures in a specially configured magnetic media. The use of heat can overcome superparamagnetic effects that might otherwise limit the areal data density of the media. As such, HAMR devices may include magnetic write heads for delivering electromagnetic energy to heat a small confined media area (spot size) at the same time the magnetic write head applies a magnetic field to the media for recording.

One way to achieve a tiny confined hot spot is to use an optical near-field transducer (NFT), such as a plasmonic optical antenna or an aperture, located near an air-bearing surface of a hard drive slider. Light may be launched from a light source (e.g., a laser diode) into optics such as a waveguide integrated into the slider. Light propagating in the waveguide may be directed to an optical focusing element, such as a planar solid immersion mirror (PSIM). The PSIM may concentrate the energy into a NFT. The NFT causes the energy to be delivered to the media in a very small spot.

Various embodiments disclosed herein are generally directed to methods, systems, and apparatuses that facilitate the reduction of power instabilities in a laser diode for HAMR. Laser diodes used in HAMR can experience power instabilities (jumps) when there is external optical feedback into the laser diode. These power instabilities can cause an undesired amount of jitter during HAMR recording. Disclosed are apparatuses and methods directed to reducing optical feedback, and therefore, the likelihood of jitter during HAMR. These embodiments may also be utilized with other devices that are susceptible to power instability due to optical feedback.

Embodiments are directed to an isolation element such as a thin film Faraday isolator that includes components such as a Faraday rotator, which is configured to change the polarization of light in order to block or substantially reduce optical feedback to a laser diode. Recent innovation to fabrication techniques such as sputtering, atomic layer deposition, evaporation, and ion beam deposition have allowed Faraday rotators, such as the embodiments disclosed herein, to be fabricated as optical thin films allowing Faraday rotators to be integrated onto semiconductor substrates.

In some embodiments, the disclosed isolation element is disposed in an optical pathway between the laser diode and the slider body. In some embodiments, the isolator element includes a magneto-optical photonic crystal with a plurality of magneto-optical film layers and a plurality of photonic band gap film layers. In some instances, at least some of the plurality of magneto-optical film layers are separated from one another by one of the plurality of band gap film layers. In additional embodiments, the magneto-optical photonic crystal has characteristics of a multiple reflector single cavity crystal according to the equation $[M/N]^x[M]^y[N/M]^x$, where $M=Bi_{2.97}Er_{0.03}Fe_4Ga_{0.5}Al_{0.5}O_{12}$, $N=Sm_3Ga_5O_{12}$, x=any integer, and y=any integer.

FIG. 1 shows a perspective view of an apparatus 100 according to an example embodiment. The apparatus 100 includes a slider body 102 having a media-facing first surface 104 and a second top surface 106. The first surface 104 faces a magnetic media surface (e.g., disk surface, not shown) during operation. A read/write head region 108 is located at the first surface 104 near a trailing edge 110 of the slider body 102. The read/write head region 108 includes respective one or more read transducers and write transducers, as well as an optical component (e.g., a near-field transducer) that directs a small beam of energy onto the media surface. The energy is provided by a laser diode 112 attached to a submount 114. Both the laser diode 112 and the submount 114 are mounted to the second top surface 106 of the slider body 102 in a laser-on-slider (LOS) configuration.

The laser diode 112 directs light along an optical pathway 116 that passes through the slider body 102 to the read/write head region 108. The optical pathway 116 passes along an optical interface (not shown) between the slider body 102 and laser diode 112. The optical pathway 116 can be formed by optics such as waveguides, etc. The laser diode 112 in this example is a longitudinal cavity, edge-emitting laser diode, and may be coupled to the waveguide via a facet, grating, lens or other coupling structure known in the art. The slider body 102 is an integrated optics device that is formed together with the optical pathway 116 and read/write head region 108. The optical pathway 116 may be formed as a layer of materials with appropriate relative refractive indices so that light propagates there along in a manner similar to an optic fiber.

In the embodiment of FIG. 1, the submount 114 is mounted to the laser diode 112 as well as the slider body 102. The submount 114 provides mechanical and electrical connections between the laser diode 112, slider body 102, interface board (not shown) and suspension (not shown). In some instances, the laser diode 112 and submount 114 may be formed using integrated optics and/or integrated circuit manufacturing processes along with the slider body 102. In other embodiments, the laser diode 112 and submount 114 may not formed together with the slider body 102 in the same layer deposition process. For example, the laser diode 112 and submount 114 can be formed separately and later attached together (e.g., using pick and place then solder reflow bonding) with the slider body 102 to form the apparatus 100. In some embodiments, such as laser-in-slider (LIS) applications, the submount can be eliminated entirely.

Figure 2:
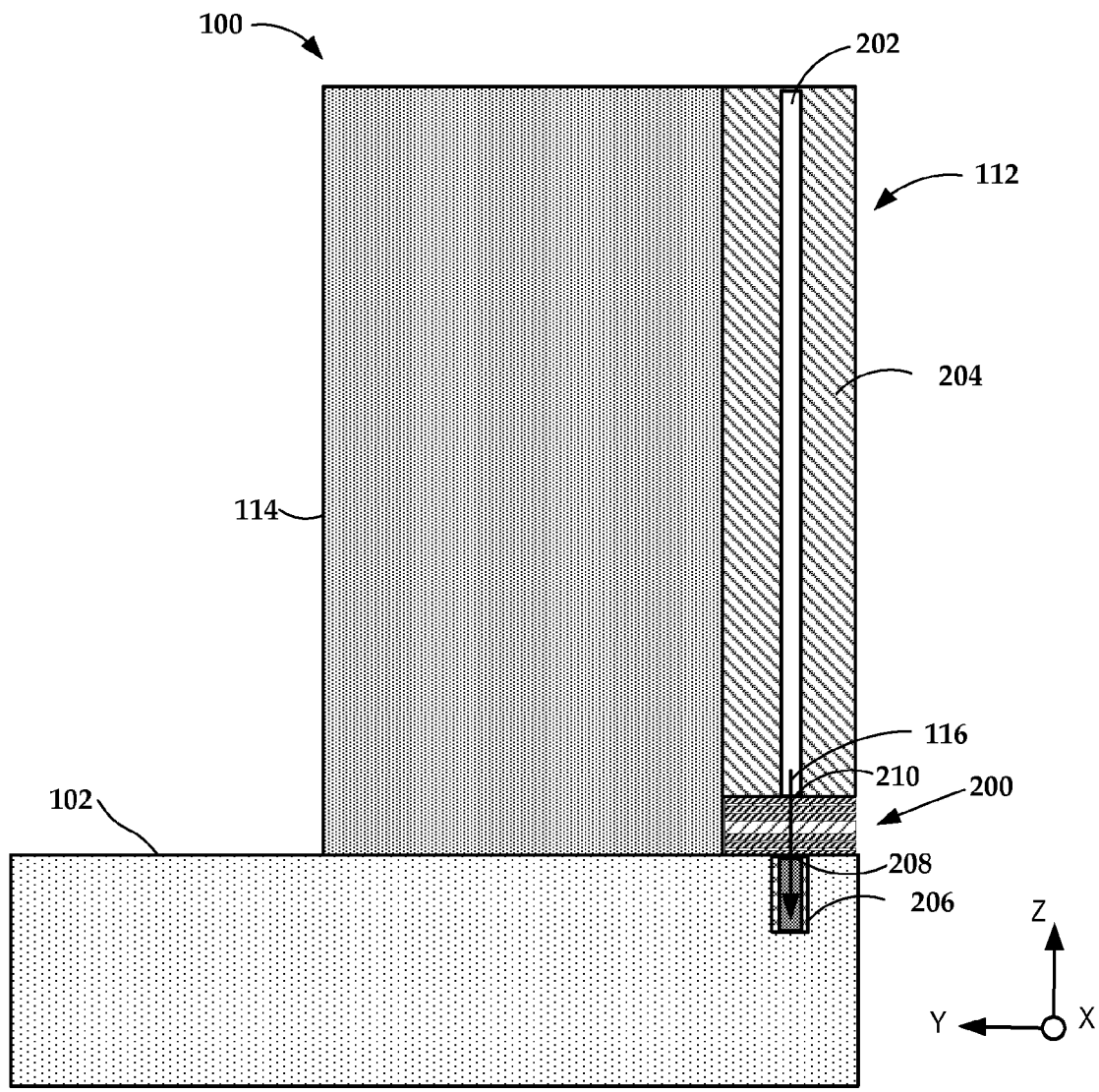
FIG. 2 is a cross-sectional view of the apparatus of FIG. 1.

FIG. 2 is a cross-sectional view of a portion of the slider body 102, laser diode 112, submount 114, and an isolator element 200. For simplicity and ease of review, the components of the laser diode 112 have been reduced to illustrate only an active region 202 and a substrate 204, and the isolator element 200 is not necessarily drawn to scale. FIG. 2 also illustrates a waveguide 206 that is part of the optical pathway 116, which extends within the slider body 102. The optical pathway 116 (indicated generally by arrow) extends from the laser diode 112 along the waveguide 206. The optical pathway 116 receives light emitted from the active region 202 and propagates the light to the read/write head region 108 (FIG. 1) along (through) the slider body 102.

As illustrated in FIG. 2, the laser diode 112 can comprise a semiconductor laser. As such, the substrate 204 may be the diced portion of an initial crystalline wafer on which a plurality of thin layers are grown, deposited, and/or patterned on a side of the wafer. The layers may include a layer of gain medium which may form one or more quantum wells with adjacent layers, and a p-contact. An n-contact may be deposited or otherwise formed on an opposite side of the substrate 204. The distribution of electrical current flow between the n-contact and p-contact may define the active region 202. Laser light may propagate within the laser diode 112 generally along the active region 202 before being transferred along the optical pathway 116.

The laser diode 112 is mounted on the slider body 102 via the submount 114. The isolator element 200 is disposed in the optical pathway 116 between the laser diode 112 and the slider body 102. As will be discussed subsequently, the isolator element 200 can comprise a thin film Faraday isolator including components such as a Faraday rotator (e.g., a magneto-optical photonic crystal), which is configured to change the polarization of light in order to block or substantially reduce optical feedback along the optical pathway 116 back to the laser diode 112.

The isolator element 200 can be comprised of thin films deposited by one or more of sputtering, atomic layer deposition, evaporation, and ion beam deposition allowing them to be integrated onto semiconductor substrates. Thus, isolator element 200 can be mounted or formed with various components of the apparatus 100 along the optical pathway 116 so as to reduce optical feedback to the laser diode 112. As illustrated in FIG. 2, the isolator element 200 can be disposed in the optical pathway 116 between the slider body 102 and laser diode 112 (e.g., between an output facet of the laser diode 112 and an input coupler of a waveguide). However, other arrangements are contemplated. The arrangement of the isolator element 200 between the slider body 102 and the laser diode 112 can be accomplished by forming (i.e. growing) or coupling the isolator element 200 on various components including the slider body 102, the laser diode 112, the submount 114, or a mountable chip such as a flip chip. Thus, in some instances the isolator element 200 can be fabricated as part of or is disposed upon the submount 114. In other embodiments, the isolator element 200 can be fabricated as part of the slider body 102 at a coupler 208 of the optical pathway 116 to the slider body 102. In yet other embodiments, the isolator element 200 can be fabricated as part of a front facet 210 of the laser diode 112 as illustrated in FIG. 2. Additionally, the isolator element 200 can be fabricated separately as a chip that is assembled to the slider body 102 or the submount 114.

Figure 3:
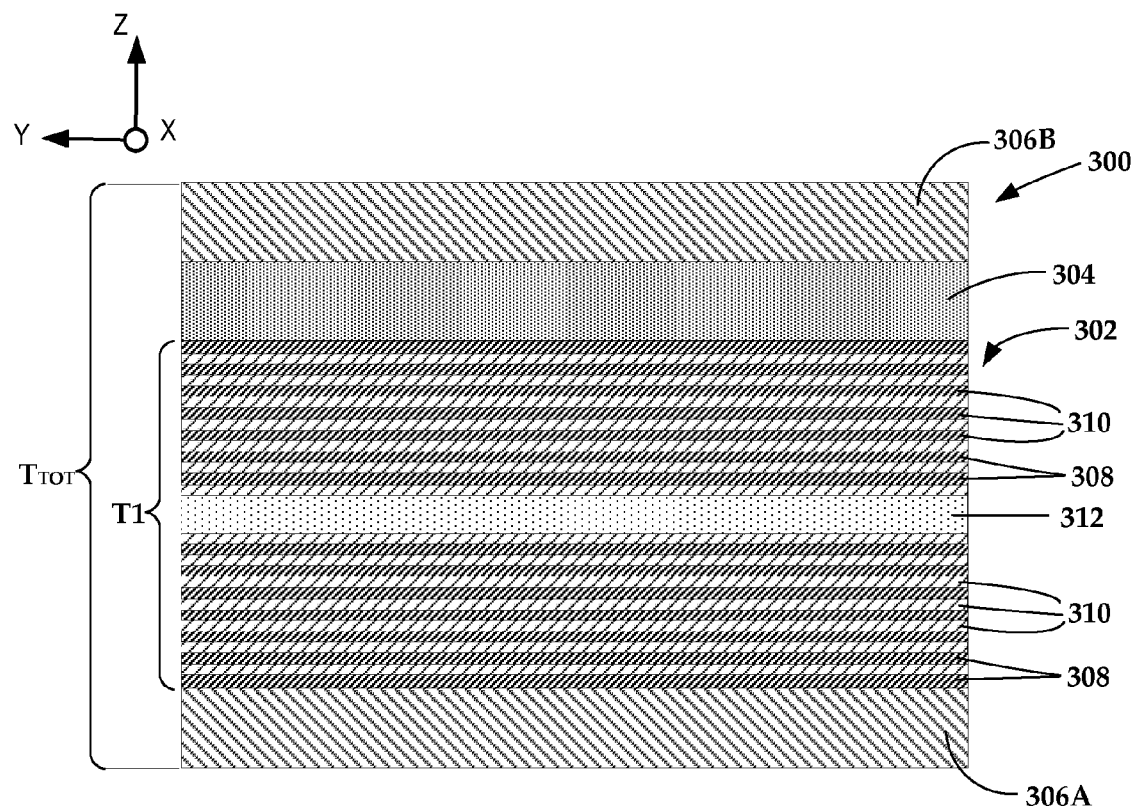
FIG. 3 is a cross-sectional view of one embodiment of the isolator element.

FIG. 3 illustrates one embodiment of an isolator element 300. The isolator element 300 includes a Faraday rotator 302, a 45° polarization rotator 304, and horizontal linear polarizers 306A and 306B. The Faraday rotator 302 includes a plurality of magneto-optical film layers 308, a plurality of photonic band gap film layers 310, and a phase shift region 312. Components of the isolator element 300 can be substantially planar (e.g., within 2 degrees of planar).

In the embodiment of FIG. 3, the Faraday rotator 302 is disposed between the first horizontal polarizer 306A and the 45° polarization rotator 304. The second horizontal polarizer 306B is disposed on an opposing side of the 45° polarization rotator 304 from the Faraday rotator 302. The components of the isolator element 300 can be comprised of optical thin films fabricated using processes such as one or more of sputtering, atomic layer deposition, evaporation, and ion beam deposition allowing them to be integrated onto semiconductor substrates. The horizontal polarizers 306A and 306B can be comprised of polymer sheets. Such sheets are commercially available from Edmund Optics, Inc. of Barrington, N.J. The thickness of the 45° polarization rotator 304 and the horizontal linear polarizers 306A and 306B can be selected based upon application criteria such as the wavelength of the light emitted by the laser diode.

Although illustrated as a single structure in FIG. 3, the 45° polarization rotator 304 can be a magneto-photonic crystal with thin film layers of magnetic optical materials (e.g., garnets) alternating with dielectric layers having a lower refractive index. This interleaved thin film structure forms a Bragg Reflector with a photonic band gap that allows for the transmission of light from a source such as a laser diode. In some instances, the 45° polarization rotator 304 can be fabricated to have a thickness (as measured in the z-direction illustrated) of between about 5-10 microns. Further discussion of polarization rotators and fabrication techniques related thereto can be found in co-pending U.S. patent application Ser. No. 13/908,693, filed Jun. 3, 2013, the disclosure of which is incorporated by reference in its entirety.

The Faraday rotator 302 can be constructed of optical thin films and comprises a magneto-optical photonic crystal. Thus, the magneto-optical photonic crystal of FIG. 3 is disposed generally between the first horizontal polarizer 306A and the second horizontal polarizer 306B. The magneto-optical photonic crystal includes the plurality of magneto-optical film layers 308 and the plurality of photonic band gap film layers 310. Thus, the structure alternates between a thin film material with high refractive layers and low refractive layers. As illustrated in FIG. 3, at least some of the plurality of magneto-optical film layers 308 are separated from one another by one of the plurality of band gap film layers 310. In some instances, the phase shift region 312 can be disposed (i.e. sandwiched) between two stacks of the interleaved plurality of magneto-optical film layers 308 and the plurality of band gap film layers 310. The phase shift region 312 can be made of one or more magneto-optical film layers to provide a strong magneto-optical effect that rotates incident light as desired (e.g., by one-quarter wavelength). Suitable materials for phase shift region 312 can include bismuth, erbium, aluminum-doped FeGaxOy, yttrium iron-indium garnet, and bismuth iron garnet (discussed subsequently).

The plurality of magneto-optical film layers 308 can comprise magnetic layers while the plurality of photonic band gap film layers 310 can comprise non-magnetic layers (e.g., dielectric). Each of the odd layers may have a same or a different composition as others of the odd layers. Similarly, each of the even layers may be of the same or a different composition as others of the even layers. In some instances the plurality of magneto-optical film layers 308 are comprised of one or more of a bismuth iron garnet (e.g., with a composition $Bi_{2.97}Er_{0.03}Fe_4Ga_{0.5}Al_{0.5}O_{12}$) and a yttrium iron-indium garnet. Similarly, in some instances the plurality of photonic band gap film layers 310 are comprised of one or more of a samarium gallium garnet (e.g., with a composition $Sm_3Ga_5O_{12}$) and gadolinium gallium garnet (e.g., with a composition $Gd_3Ga_5O_{12(111)}$). In some embodiments, the magneto-optical photonic crystal has characteristics of a multi-reflector single cavity crystal according to the equation $[M/N]^x[M]^y[N/M]^x$, where M represents one of the magneto-optical film layers 308, N represents one of the plurality of photonic band gap film layers 310, x represents the number of layered pair thin film layers and y represents the number of film layers. In some embodiments, $M=Bi_{2.97}Er_{0.03}Fe_4Ga_{0.5}Al_{0.5}O_{12}$, $N=Sm_3Ga_5O_{12}$, x=any integer, and y=any integer. Thus, in some embodiments magneto-optical photonic crystal can have the characteristics of a seven reflector single cavity crystal according to the equation $[M/N]^7[M]^2[N/M]^7$, with $M=Bi_{2.97}Er_{0.03}Fe_4Ga_{0.5}Al_{0.5}O_{12}$ and $N=Sm_3Ga_5O_{12}$. $[M]^2$ represents a double thick cavity layer.

FIG. 3 illustrates the plurality of magneto-optical film layers 308 and the plurality of photonic band gap film layers 310 arranged in the exemplary $[M/N]^7[M]^2[N/M]^7$ pattern, where M is one of the plurality of magneto-optical film layers 308 and N is one of the plurality of photonic band gap film layers 310. Thus, moving in the z-direction of the Cartesian coordinate system illustrated (in a direction away from the first horizontal polarizer 306A) seven magneto-optical film layers (M) are interposed between seven photonic band gap film layers (N). Two layers of magneto-optical film layers (M) (comprising phase shift region 312) are disposed together and seven photonic band gap film layers (N) are interposed between even magneto-optical film layers (M). In some embodiments, the Faraday rotator 302 can be formed on a substrate (not shown) such as silicon, samarium gallium garnet, or other suitable materials.

The thickness of the plurality of magneto-optical film layers 308 and the plurality of photonic band gap film layers 310 can vary from embodiment to embodiment and can be dependent upon criteria such as the wavelength of the light emitted by the laser diode and the refractive index of the material of the individual thin film layer. In some embodiments, each of the plurality of magneto-optical film layers 308 and each of the plurality of photonic band gap film layers 310 can have a thickness that is a quarter of the resonant peak wavelength of the laser diode (e.g., 830 nm). Thus, each individual thin film layer can have a thickness in the z-direction given by: (1) $\lambda_{peak}/(4*n)$, where $\lambda_{peak}$ is the resonant peak wavelength of the light from the laser diode and n is the refractive index of the material of the individual thin film layer. Therefore, the total thickness $T_1$ of the Faraday rotator 302 in some embodiments is on the order of 5 to 10 µm. As the 45° polarization rotator 304 and the horizontal linear polarizers 306A and 306B have similar thicknesses to the Faraday rotator 302 the total thickness $T_{TOT}$ of the isolator element 300 can be on the order of 5 to 25 µm making it possible to dispose the isolator element 300 in the optical pathway 116 between the laser diode 112 and the slider body 102 (FIG. 2). The isolator element 300 can be used effectively in a HAMR device to limit optical feedback along the optical pathway 116 back to the laser diode 112.

Figure 4A:
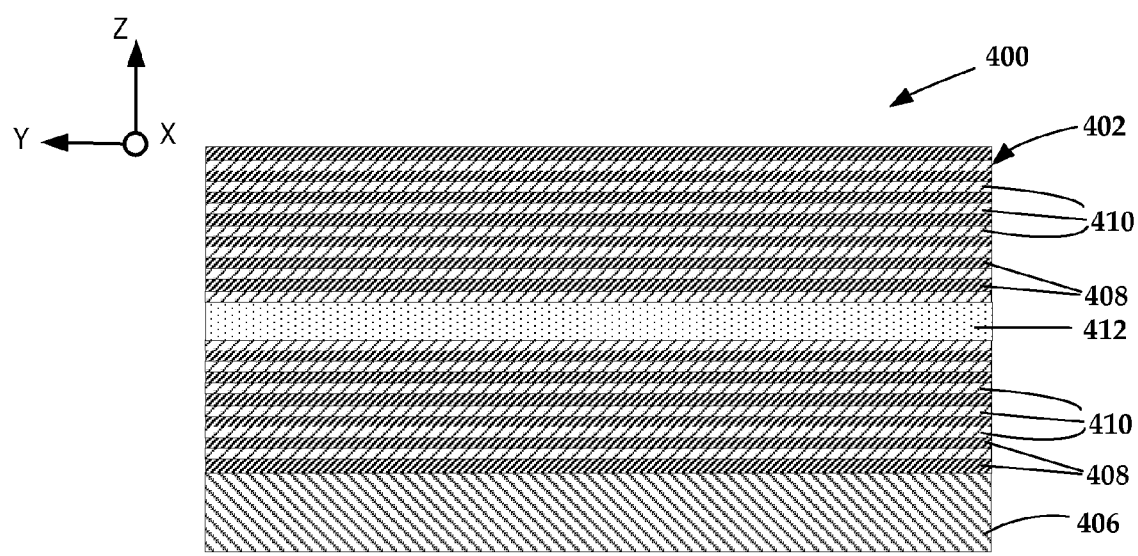
FIG. 4A is a cross-sectional view of another embodiment of the isolator element.

FIG. 4A illustrates another embodiment of an isolator element 400. Similar to the embodiment of FIG. 3, the isolator element 400 includes a Faraday rotator 402 and a horizontal polarizer 406. The Faraday rotator 402 includes a plurality of magneto-optical film layers 408, a plurality of photonic band gap film layers 410, and a phase shift region 412. The isolator element 400 is constructed and arranged in the manner previously discussed in reference to the embodiment of FIG. 3, and therefore will not be discussed in great detail. Elimination of the 45° polarization rotator (or a half-wave plate) and one of the horizontal linear polarizers can reduce the total height of the isolator element 400 to about 15 μm.

FIG. 4B illustrates yet another embodiment of an isolator element 500 including a Faraday rotator 502 with a plurality of magneto-optical film layers 508, a plurality of photonic band gap film layers 510, and a phase shift region 512. The isolator element 500 additionally includes a thin film micro-lens 514 as further shown in FIGS. 5A and 5B. The thickness (as measured in the z-direction) of the isolator element 500 for the embodiment of FIG. 4B is on the order of 5 to 10 μm.

As illustrated in FIGS. 5A and 5B, the micro-lens 514 can be fabricated into a surface of the isolator element 500 using methods such as one or more of sputtering, atomic layer deposition, evaporation, ion beam deposition, and etching allowing the micro-lens 514 to be integrated onto the Faraday rotator 502 or another component such as a polarizer, a polarization rotator, etc. The micro-lens 514 can aid in imaging the beam from the laser diode onto a front facet of the waveguide 206 (FIG. 2), and can be refractive or diffractive As shown in FIGS. 5A and 5B, the micro-lens 514 is comprised of a layer or layers having a different thickness (as measured in the z-directions) than adjacent layers. This thickness can be on the order of a few μm. Thus, the thickness of the micro-lens 514 can be a few μm (i.e. between 1.0 and 3.0 μm).

Figure 6A:
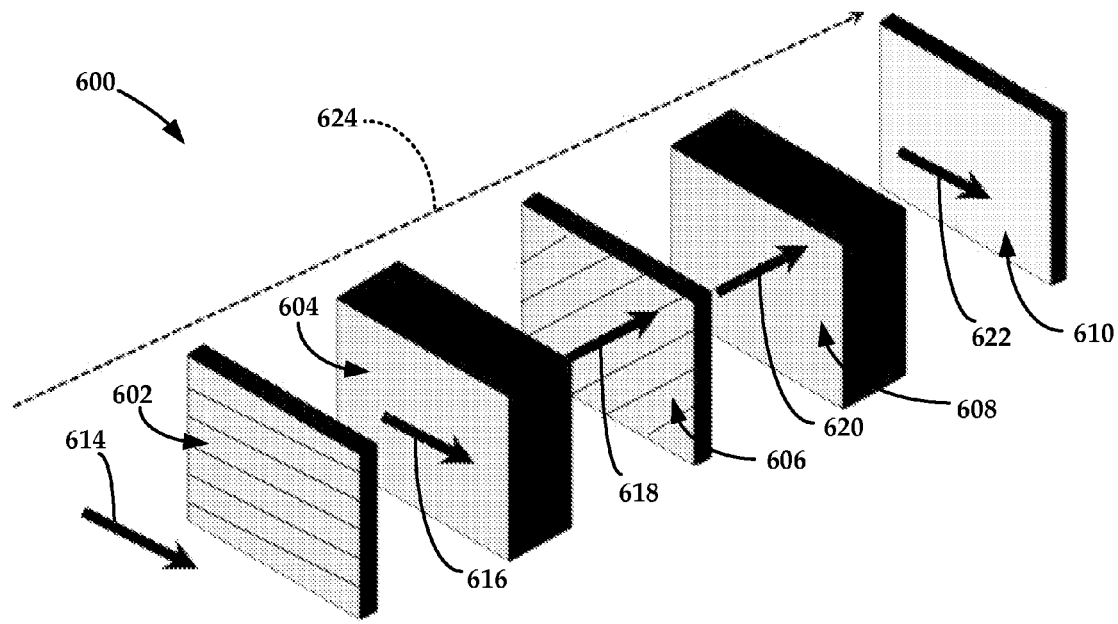
FIG. 6A is an exploded view of one embodiment of the isolator element illustrating a polarization of a light emitted from a laser diode passing sequentially through various components of the isolator element.

FIG. 6A shows an exploded view of another embodiment of an isolator element 600. FIG. 6A also illustrates a polarization of a light emitted from a laser diode (e.g., laser diode 112) passing sequentially through various components of the isolator element 600. The components of the isolator element 600 include a horizontal polarizer 602, a Faraday rotator 604, a 45° linear polarizer 606, and a half-wave plate 608. A reflector 610 that can be a component such as a coupler, an air bearing surface, a near-field transducer, and/or a disk medium, etc., is also illustrated in FIG. 6A.

Arrow 614 indicates the polarization of the optical field leaving the laser diode. Successive arrows 614, 616, 618, 620, and 622 illustrate the polarization of light from the laser diode as it enters successive components. Dashed arrow 624 indicates the general direction of travel of the light. As shown in FIG. 6A, the Faraday rotator 604 and the half-wave plate 608 (or a 45° polarization rotator) are capable of shifting the phase of the light as illustrated by arrows 618 and 622. The polarization of the optical field leaving the laser diode is the same as the polarization of the optical field entering optics of the slider body such as a waveguide. Thus, the configuration of the isolator element 600 allows a laser with a TE optical field to output to a TE waveguide.

Figure 6B:
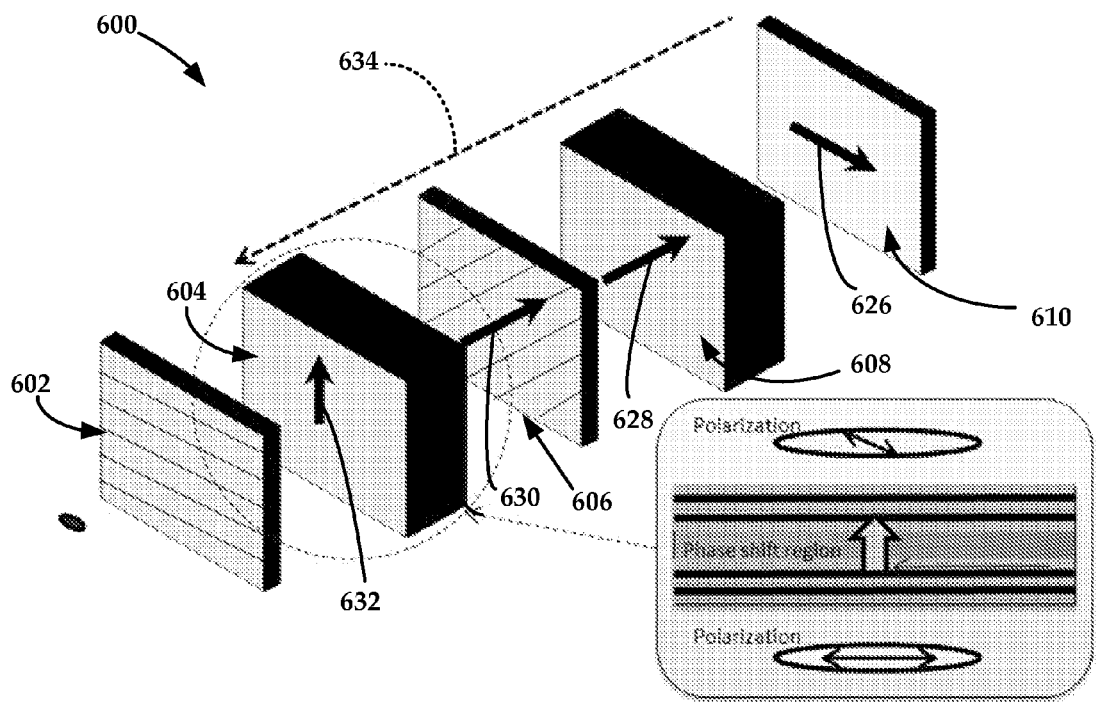
FIG. 6B is an exploded view of the embodiment of the isolator element of FIG. 6A illustrating the polarization of light reflected back toward the laser diode through various components of the isolator element.

FIG. 6B shows the components of the isolator element 600 including the horizontal polarizer 602A, the Faraday rotator 604, the 45° linear polarizer 606, and the half-wave plate 608. The reflector 610 is also illustrated. FIG. 6B illustrates the polarization of light reflected back toward the laser diode from the reflector 610 through the various components of the isolator element 600.

Arrows 626, 628, 630, 632 illustrate the polarization of the reflected light from the reflector 610 as it enters successive components of the isolator element 600. Dashed arrow 634 indicates the general direction of travel of the light. The Faraday rotator 604 and the half-wave plate 608 (or a 45° polarization rotator) are capable of shifting the phase of the reflected light as illustrated by arrows 628 and 632. As shown, the Faraday rotator 604 is capable of further shifting the phase of the reflected light such that the capability of the reflected light to enter back into the laser diode at high intensity is substantially reduced. In this manner, the field intensity of the reflected light can be reduced by between 30 and 40 dB from an outgoing field intensity of the laser diode.

Figure 7A:
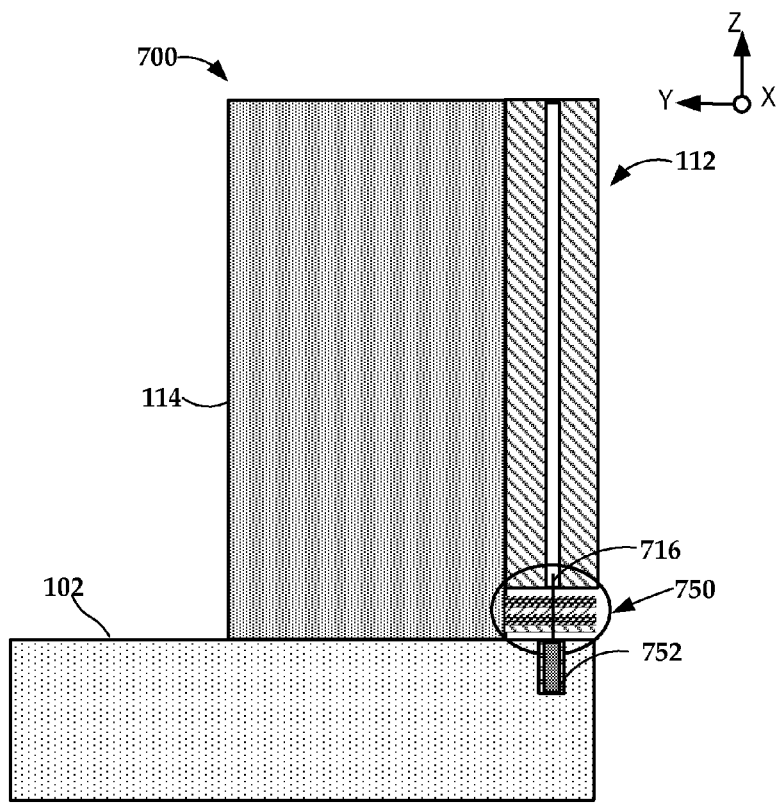
FIG. 7A is a cross-sectional view of another embodiment of an apparatus.
Figure 9:
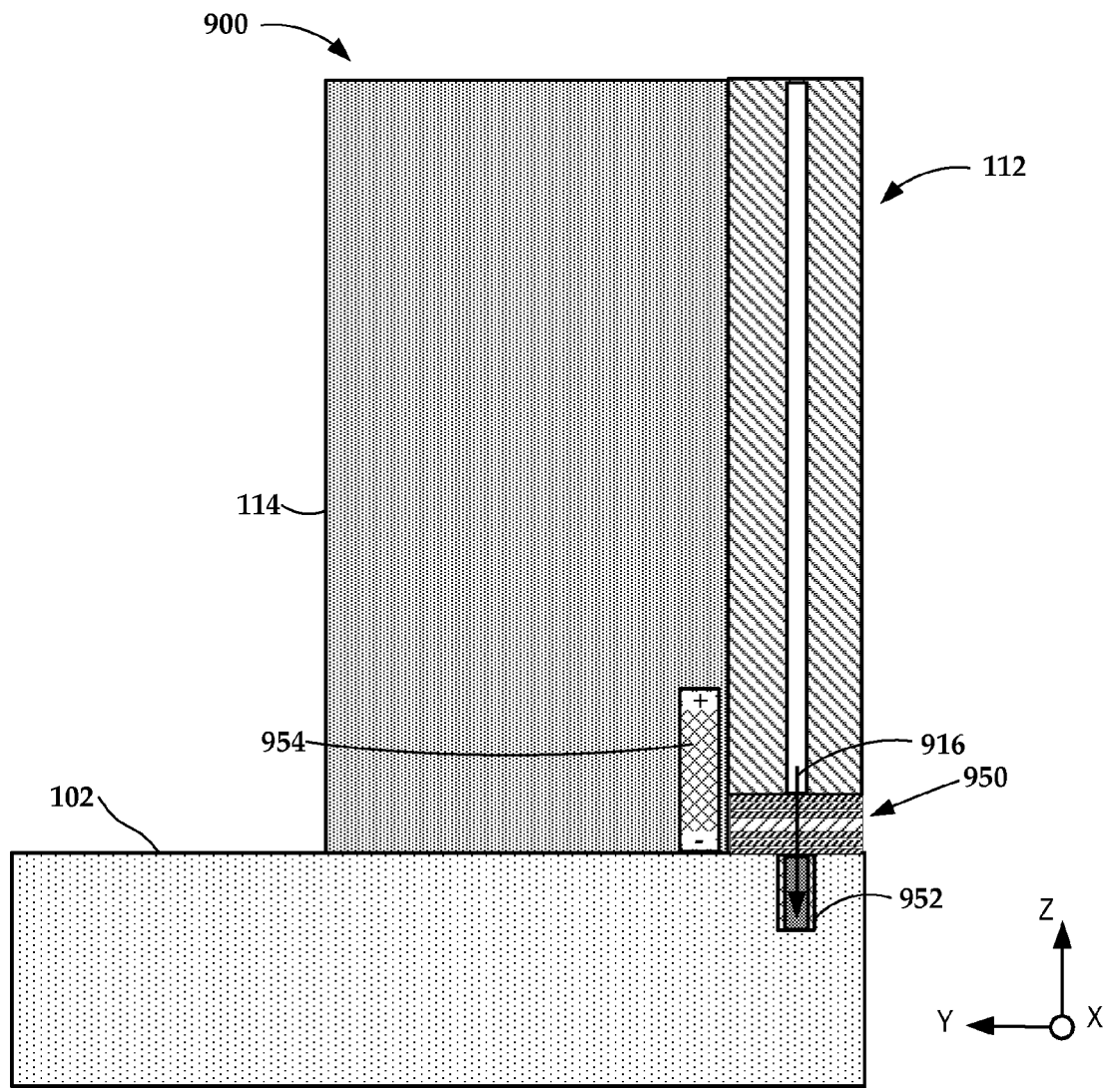
FIG. 9 is a cross-sectional view of an apparatus that includes a hard drive slider, a submount, a laser diode, and an isolator element according to an exemplary embodiment.

FIG. 7A is a cross-sectional view of another embodiment of an apparatus 700. FIG. 9 illustrates a portion of a slider body 102 (such as the slider body 102 from FIG. 2), a laser diode 112 (such as the laser diode 112 from FIG. 2), a submount 114 (such as the submount 114 from FIG. 2), and isolator element 750. FIG. 7 also illustrates a waveguide 752 that is part of the optical pathway 716, which extends within the slider body 102.

Figure 7B:
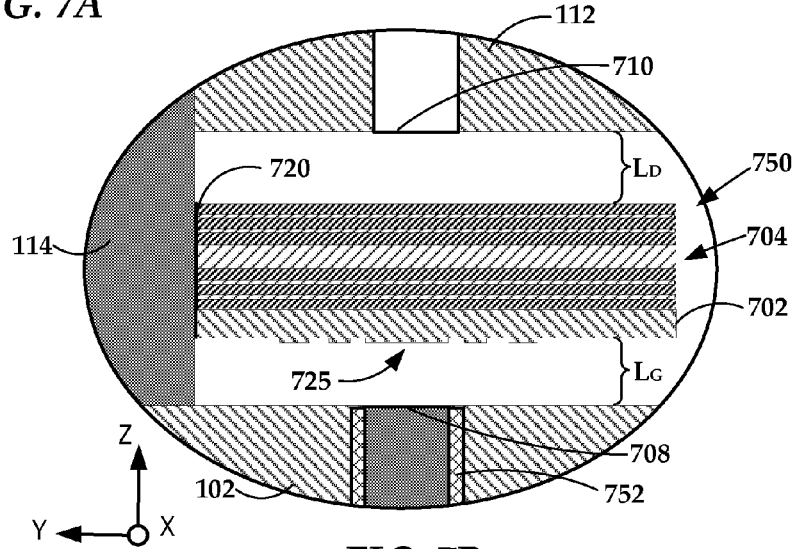
FIG. 7B is an enlargement of a region of the apparatus of FIG. 7A.

FIG. 7B is an enlargement of a region of the apparatus 700 of FIG. 7A. Thus, FIG. 7B illustrates portions of the slider body 102, the laser diode 112, and the submount 114. Additionally, FIG. 7B shows isolator element 750, which includes a horizontal polarizer 702, a Faraday rotator 704, and a micro-lens 725.

The enlargement shows the isolator element 750 configured as a chip and bonded to the submount 114 in a flip-chip manner along a surface 720 thereof. The bonding can be done via solder or another attachment mechanism. As illustrated in FIGS. 7A and 7B the thin film layers are oriented substantially parallel (i.e., within two degrees) to the ABS and other surfaces of the slider body 102 and/or the laser diode 112.

As shown in FIG. 7B, the isolator element 750 is disposed between an output facet 710 of the laser diode 112 and an input facet 708 (coupler) of the waveguide 752. More particularly, the isolator element 750 is spaced from the output facet 710 by length $L_D$ and is spaced from the input facet 708 (coupler) of the waveguide 752 by length $L_G$. The lengths $L_D$ and $L_G$ can be between about 50 and 100 microns. In some cases, the length $L_G$<the length $L_D$. The embodiment of FIGS. 7A and 7B illustrates an embodiment where the micro-lens 725 is fabricated as part of the horizontal polarizer 702. The thickness of the micro-lens 725 is exaggerated in FIG. 7B to aid the viewer. The micro-lens 725 can be used to focus light to the input facet 708 (coupler) of the waveguide 752.

Figure 8:
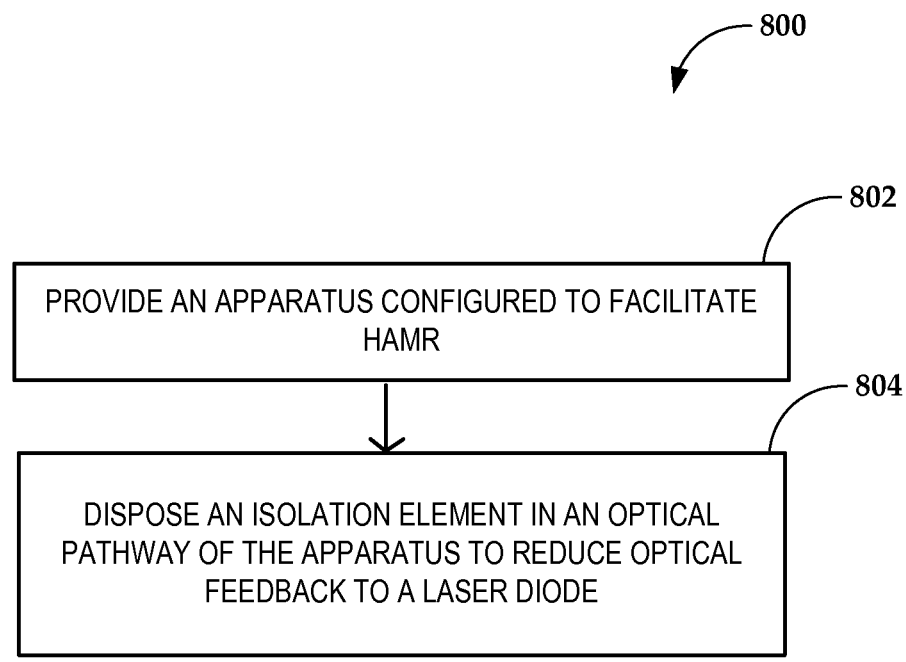
FIG. 8 is a diagram of a method according to an example embodiment.

FIG. 8 illustrates a method 800 that can be utilized with the various apparatuses and systems discussed herein. The method 800 provides an apparatus configured to facilitate heat assisted magnetic recording at step 802. In step 804, the isolation element is disposed in an optical pathway of the apparatus to reduce optical feedback to a laser diode. Further steps or substeps can be performed with the method 800 including fabricating the isolation element as part of one or more of a slider body, the laser diode, a submount, and a chip. The fabricating of the isolate element can be performed by one or more of sputtering, atomic layer deposition, evaporation, and ion beam deposition. In some instances, the isolation element can be disposed along the optical pathway by mounting the isolation element to one or more of a slider body and the laser diode. In other embodiments, the method includes forming a micro-lens on one or more layers of the isolation element.

FIG. 9 is a cross-sectional view of another embodiment of an apparatus 900. FIG. 9 illustrates a portion of a slider body 102 (such as the slider body 102 from FIG. 2), a laser diode 112 (such as the laser diode 112 from FIG. 2), a submount 114 (such as the submount 114 from FIG. 2), and isolator element 950. FIG. 9 also illustrates a waveguide 952 that is part of the optical pathway 916, which extends within the slider body 102. The components of the apparatus 900 are constructed and arranged in the manner previously discussed in reference to the embodiment of FIG. 2, and therefore, will not be discussed in great detail. However, the apparatus 900 further includes a magnet 954. The magnet 954 is disposed adjacent the isolator element 950 and the laser diode 112 and is used if the phase shift region within the isolator element 950 has a magnetization latching parallel to the film out-of-plane direction during film growth. Additionally, the magnet 954 is positioned such that the magnetic flux lines of the magnet 954 are in a direction of light propagation through the isolator element 950. Thus, the magnet 954 functions to align magnetization direction of a phase shift region of the isolator element 950 in the direction of light propagation so as to aid the magneto-optical effect that rotates the polarization of the light. The magnet 954 may be located within another component or in another orientation proximate the isolator element 950, e.g., yz-plane, and/or may surround two or more sides of the isolator element 950.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. All references cited within are herein incorporated by reference in their entirety.

What is claimed is:

1. An apparatus, comprising:
a slider body having an optical pathway extending therealong;
a laser diode configured to emit light along the optical pathway; and
an isolator element disposed in the optical pathway to reduce optical feedback along the optical pathway back to the laser diode, the isolator element comprising a magneto-optical photonic crystal including a plurality of magneto-optical film layers and a plurality of photonic band gap film layers, wherein at least some of the plurality of magneto-optical film layers are separated from one another by one of the plurality of band gap film layers.

2. The apparatus of claim 1, wherein the magneto-optical photonic crystal has characteristics of a seven reflector single cavity crystal according to the equation $[M/N]^x[M]^y[N/M]^x$, where $M=Bi_{2.97}Er_{0.03}Fe_4Ga_{0.5}Al_{0.5}O_{12}$, $N=Sm_3Ga_5O_{12}$, x=any integer, and y=any integer.

3. The apparatus of claim 1, wherein the plurality of magneto-optical film layers are comprised of one or more of a bismuth iron garnet and a yttrium iron-indium garnet, and wherein the plurality of photonic band gap film layers are comprised of one or more of a samarium gallium garnet and a gadolinium gallium garnet.

4. The apparatus of claim 1, wherein the plurality of magneto-optical film layers comprise $Bi_{2.97}Er_{0.03}Fe_4Ga_{0.5}Al_{0.5}O_{12}$ and the plurality of photonic band gap film layers comprise $Sm_3Ga_5O_{12}$.

5. The apparatus of claim 1, wherein the isolator element has a thickness between about 5 and 25 microns.

6. The apparatus of claim 1, wherein the isolator element is disposed between an output facet of the laser diode and an input coupler of the optical pathway within the slider body.

7. The apparatus of claim 1, wherein the isolator element is fabricated as part of or is disposed upon a submount for the laser diode.

8. The apparatus of claim 1, wherein the isolator element is fabricated as part of the slider body at an input coupler of the optical pathway to the slider body.

9. The apparatus of claim 1, wherein the isolator element is fabricated as part of an output facet of the laser diode.

10. The apparatus of claim 1, wherein the isolator element is fabricated as a chip that is assembled to one or more of the slider body, the laser diode, or a submount.

11. The apparatus of claim 1, wherein the isolator element includes one or more of a horizontal polarizer, a 45° linear polarizer, a half-wave plate, and a 45° polarization rotator.

12. The apparatus of claim 1, wherein the isolator element includes a micro-lens.

13. An apparatus comprising:
a system configured to facilitate heat assisted magnetic recording, comprising:
a slider body;
a laser diode mounted to the slider body; and
an isolator element disposed in an optical pathway between the laser diode and the slider body to reduce optical feedback along the optical pathway back to the laser diode, the isolator element comprising a magneto-optical photonic crystal having characteristics of a seven reflector single cavity crystal according to the equation $[M/N]^x[M]^y[N/M]^x$, where $M=Bi_{2.97}Er_{0.03}Fe_4Ga_{0.5}Al_{0.5}O_{12}$, $N=Sm_3Ga_5O_{12}$, x=any integer, and y=any integer.

14. A method, comprising:
providing an apparatus configured to facilitate heat assisted magnetic recording having a laser diode; and
disposing an isolation element in an optical pathway of the apparatus to reduce optical feedback to the laser diode, the isolation element comprising a magneto-optical photonic crystal including a plurality of magneto-optical film layers and a plurality of photonic band gap film layers, wherein at least some of the plurality of magneto-optical film layers are separated from one another by one of the plurality of band gap film layers.

15. The method of claim 14, wherein the step of disposing the isolation element along the optical pathway includes fabricating the isolation element as part of one or more of a slider body, the laser diode, a submount, and a chip.

16. The method of claim 15, wherein the step of fabricating includes one or more of sputtering, atomic layer deposition, evaporation, and ion beam deposition.

17. The method of claim 14, wherein the step of disposing the isolation element along the optical pathway includes mounting the isolation element to one or more of the slider body and the laser diode.

18. The method of claim 14, the step of fabricating includes forming a refractive or defractive micro-lens on one or more layers of the isolation element.

* * * * *